United States Patent
Wang et al.

(10) Patent No.: US 11,269,148 B2
(45) Date of Patent: Mar. 8, 2022

(54) ORGANIZER FOR FIBER OPTIC COMPONENTS

(71) Applicant: II-VI DELAWARE, INC., Wilmington, DE (US)

(72) Inventors: Yajun Wang, Naperville, IL (US); Ian McClean, Brixham (GB); Eric T. Green, Corning, NY (US)

(73) Assignee: II-VI DELAWARE, INC., Wilmington, DE (US)

( * ) Notice: Subject to any disclaimer, the term of this patent is extended or adjusted under 35 U.S.C. 154(b) by 0 days.

(21) Appl. No.: 16/861,059

(22) Filed: Apr. 28, 2020

(65) Prior Publication Data
US 2021/0333495 A1    Oct. 28, 2021

(51) Int. Cl.
*G02B 6/42*    (2006.01)

(52) U.S. Cl.
CPC ........... *G02B 6/428* (2013.01); *G02B 6/4261* (2013.01); *G02B 6/4269* (2013.01); *H05K 2201/10121* (2013.01)

(58) Field of Classification Search
None
See application file for complete search history.

(56) References Cited

U.S. PATENT DOCUMENTS

| | | | | |
|---|---|---|---|---|
| 4,972,042 A * | 11/1990 | Seabourne | ........... | G02B 6/4428 174/23 R |
| 5,596,665 A * | 1/1997 | Kurashima | .......... | G02B 6/4246 385/92 |
| 5,659,641 A * | 8/1997 | DeMeritt | ............. | G02B 6/4453 385/135 |
| 5,857,054 A * | 1/1999 | Thomas | ................. | G02B 6/426 385/134 |
| 6,402,393 B1* | 6/2002 | Grimes | ................ | G02B 6/3897 385/56 |
| 6,456,772 B1* | 9/2002 | Daoud | ................ | G02B 6/4471 385/135 |
| 2002/0003940 A1* | 1/2002 | Araki | ................... | G02B 6/4471 385/137 |
| 2006/0243868 A1* | 11/2006 | Nakamura | .......... | G02B 6/3636 248/113 |
| 2011/0026893 A1* | 2/2011 | Omori | ................. | G02B 6/4453 385/135 |

(Continued)

FOREIGN PATENT DOCUMENTS

JP         2013-148630 A   *   8/2013

*Primary Examiner* — Michael Stahl
(74) *Attorney, Agent, or Firm* — Blank Rome LLP

(57) ABSTRACT

An optoelectronic module includes a housing and a printed circuit board ("PCB") positioned within the housing. A positioning member is coupled to the PCB and includes one or more receptacles each configured to receive and secure positioning of an optical component relative to the PCB. The positioning member may include a plurality of receptacles positioned relative to one another in an arrangement defining a vertical array of receptacles, a lateral array of receptacles, or both. In one form, an optical component, when positioned in a receptacle of the positioning member, is spaced from the PCB. The positioning member may be formed of a thermally insulative or thermally conductive material, and a number of optical fibers may be routed between the positioning member and the housing.

20 Claims, 10 Drawing Sheets

(56) References Cited

U.S. PATENT DOCUMENTS

| | | | |
|---|---|---|---|
| 2015/0086170 A1* | 3/2015 | Bridges | G02B 6/4471 |
| | | | 385/135 |
| 2018/0031788 A1* | 2/2018 | Duran | G02B 6/4251 |
| 2018/0045906 A1* | 2/2018 | Cams | G02B 6/4248 |
| 2020/0393632 A1* | 12/2020 | Wallace | G02B 6/4478 |

* cited by examiner

ORGANIZER FOR FIBER OPTIC COMPONENTS

FIELD

The present disclosure generally relates to optoelectronic modules. More particularly, but not exclusively, the present disclosure relates to the positioning and arrangement of various components in optoelectronic modules.

BACKGROUND

Unless otherwise indicated herein, the materials described herein are not prior art to the claims in the present application and are not admitted to be prior art by inclusion in this section.

Communication modules, such as optoelectronic modules, may include various components that engage in the transmission and reception of optical signals. Some of the components may be housed within a shell of the optoelectronic module. The optoelectronic module itself is operably received within a host device that serves as one component of a communications network.

To engage in optical communication with other communications modules, the optoelectronic module may operably connect with a connectorized fiber optic cable which includes one or more optical fibers. The optoelectronic module may include a transmit port or a receive port configured to receive the connector of the optical fiber. Optical signals may be received or transmitted by the optoelectronic module via the optical fiber. Optical signals received by the optoelectronic module may be converted to electrical signals. Conversely, the optoelectronic module may convert electrical signals to optical signals for transmission.

Optoelectronic modules may include a number of components in addition to those already identified, and the relative positioning of these components and optical fibers which may also be present can, under some circumstances, complicate assembly of the optoelectronic modules. In addition, the functionality of certain components within optoelectronic modules may be adversely affected by increased temperatures caused by heat generated during their operation or the operation of other components. Similarly, if components are arranged within an optoelectronic module in a manner that fails to properly dissipate heat from the optoelectronic module, the functionality of the optoelectronic module may suffer.

The subject matter claimed herein is not limited to implementations that solve any disadvantages or that operate only in environments such as those described above. Rather, this background is only provided to illustrate one example technology area where some implementations described herein may be practiced.

SUMMARY

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter.

In one example embodiment, an optoelectronic module includes a housing and a printed circuit board ("PCB") positioned within the housing. A positioning member is coupled to the PCB and includes a number of receptacles each configured to receive and secure positioning of an optical component relative to the PCB. When positioned in a first receptacle of the positioning member, an optical component is spaced from the PCB.

In another example embodiment, an optoelectronic module includes a housing and a PCB positioned within the housing. A positioning member is coupled to the PCB and includes a base portion, a vertical portion extending from the base portion, and a first receptacle and a second receptacle positioned on the vertical portion. The first receptacle and the second receptacle are configured to receive and secure positioning of an optical component relative to the PCB, and the first receptacle is positioned between the second receptacle and the PCB.

In still another example embodiment, an optoelectronic module includes a housing and a PCB is positioned within the housing. A positioning member is coupled to the PCB and includes a number of receptacles each configured to receive and secure positioning of an optical component relative to the PCB, and a first receptacle of the number of receptacles is spaced from the PCB toward a heat dissipating exterior portion of the housing.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION

Reference will now be made to the drawings to describe various aspects of example embodiments of the invention. It is to be understood that the drawings are diagrammatic and schematic representations of such example embodiments, and are not limiting of the present invention, nor are they necessarily drawn to scale.

The present disclosure generally relates to optoelectronic modules. In particular, some embodiments relate to optoelectronic modules which include a positioning member coupled to a PCB and configured to receive and position one or more optical components relative to the PCB. Although various embodiments are described in the context of optoelectronic modules used in the field of optical networking, the embodiments disclosed herein may be employed in other fields or operating environments where the functionality disclosed herein may be useful. Accordingly, the scope of the invention should not be construed to be limited to the example implementations and operating environments disclosed herein.

Figure 1:
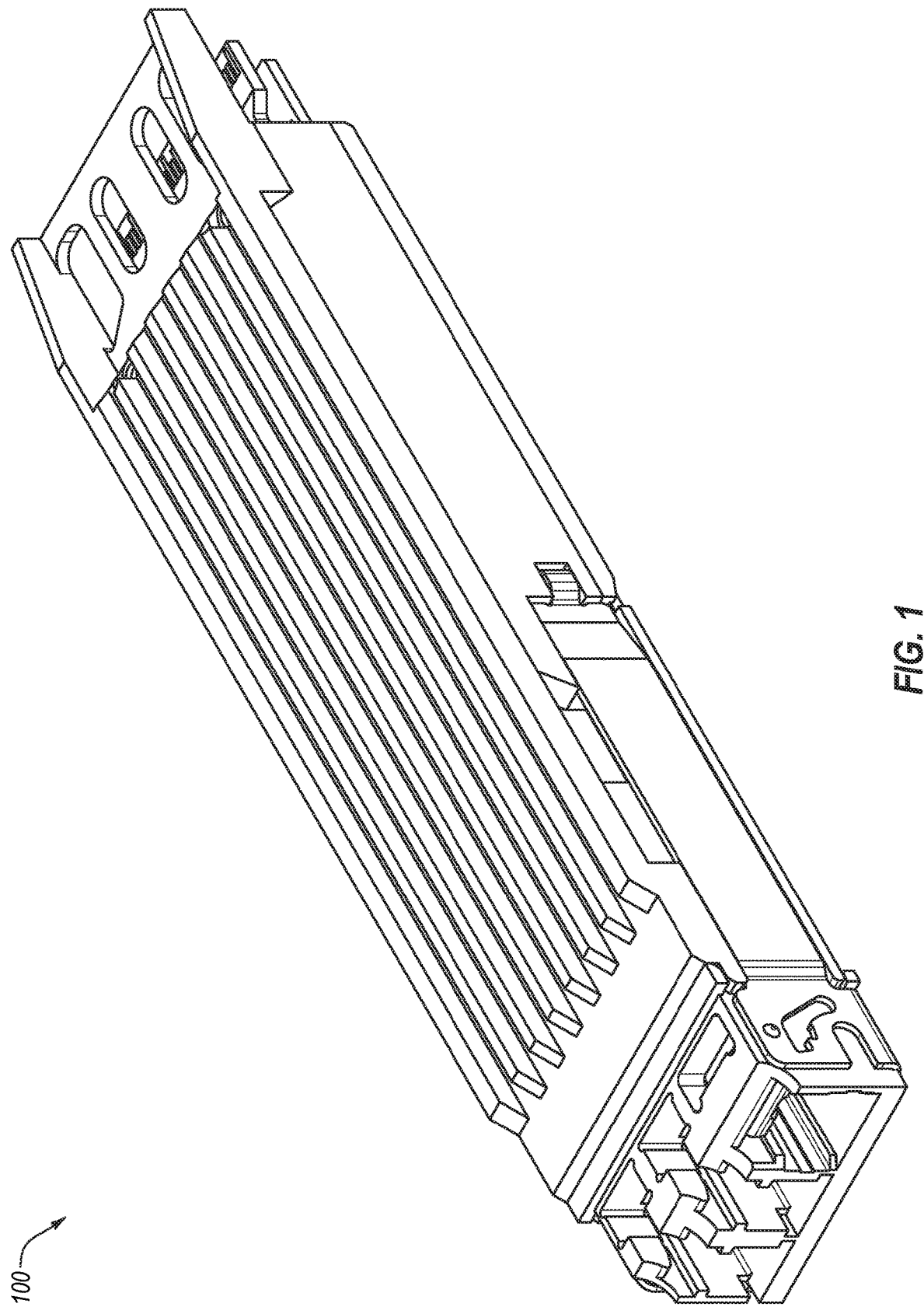
FIG. 1 is a perspective view of an optoelectronic module.
Figure 2:
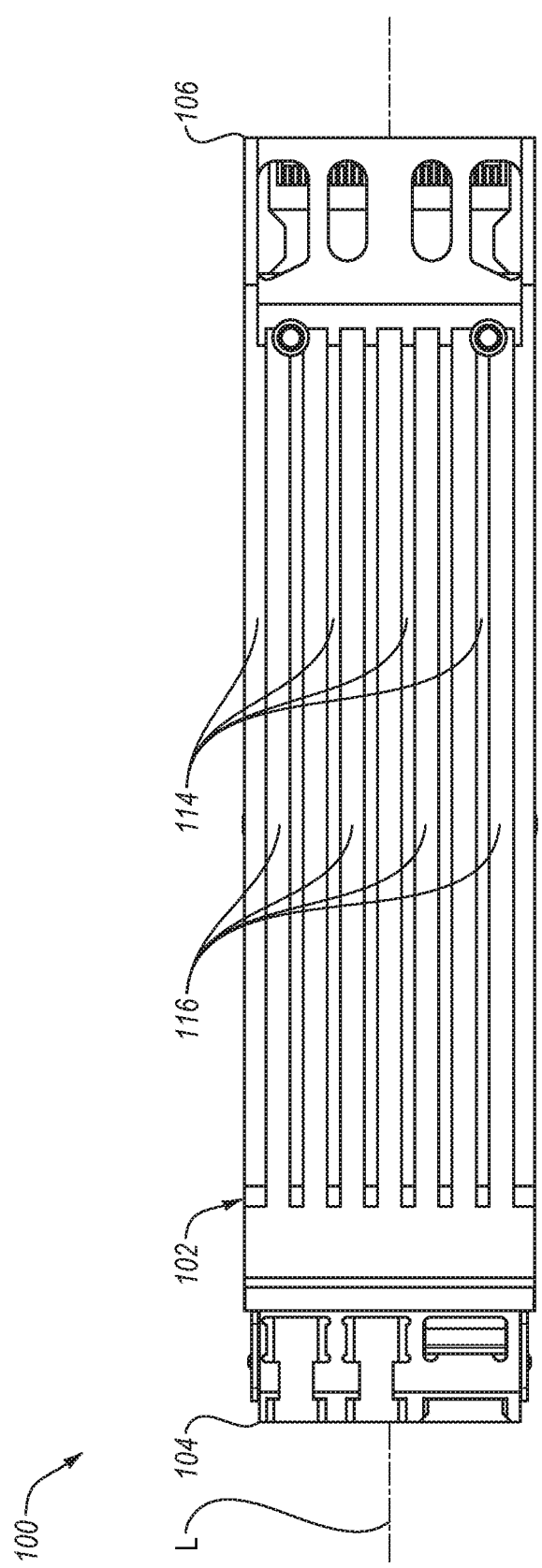
FIG. 2 is a plan view of the optoelectronic module of FIG. 1.
Figure 3:
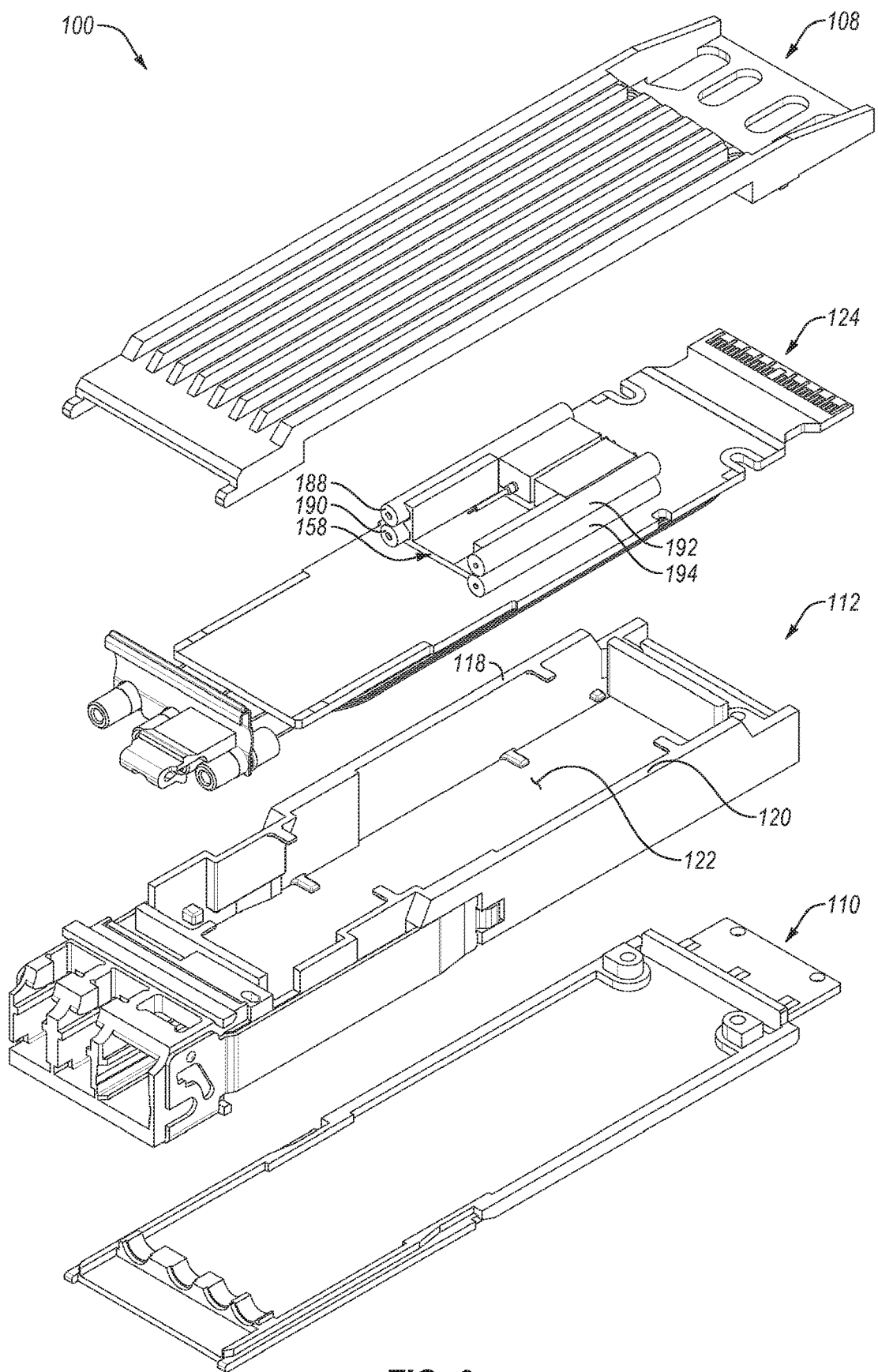
FIG. 3 is a perspective, partially exploded view of the optoelectronic module of FIG. 1.

With general reference to FIGS. 1-3 for example, there is illustrated an example embodiment of an optoelectronic module 100. As illustrated, optoelectronic module 100 includes a housing 102 that extends along a longitudinal axis L of optoelectronic module 100 between a first end 104 and a second end 106 of optoelectronic module 100. Housing 102 includes a first cover 108, a second cover 110, and an intermediate portion 112 configured to engage with first cover 108 and second cover 110.

During use of optoelectronic module 100, one or more of the components included in housing 102 may produce heat, and the functionality of some of these components may be adversely affected when subjected to increased temperature. To control the temperature inside housing 102 and avoid heat related impact to components therein, housing 102 may be formed of a thermally conductive material such that housing 102 may transfer heat from its interior to, for example, the ambient atmosphere in which it is used. In addition, one or more aspects of the physical structure of housing 102 may be designed to enhance the transfer of heat from optoelectronic module 100. As identified in FIG. 2 for example, first cover 108 in the illustrated form includes a plurality of elongate fins 114 positioned between first end 104 and second end 106 and extending along longitudinal axis L. A plurality of spaces 116 are positioned between and separate elongate fins 114 from one another. For the sake of clarity, only a few of elongate fins 114 and spaces 116 have been identified in FIG. 2. The design of first cover 108 including elongate fins 114 and spaces 116 increases its exterior surface area, and its ability to transfer heat to the ambient atmosphere, relative to forms where these features are not present. When optoelectronic module 100 is used in the orientation illustrated, i.e., where first cover 108 is on the upper side of optoelectronic module 100, heat within housing 102 will rise toward first cover 108 which may, in turn, transfer the heat to the ambient atmosphere.

Intermediate portion 112 includes a pair of oppositely positioned sidewalls 118 and 120 which, in cooperation with first cover 108 and second cover 110 when these components are engaged with intermediate portion 112, entirely or substantially enclose a hollow interior 122 of optoelectronic module 100. Hollow interior 122 houses a number of components of optoelectronic module 100 including, for example, PCB 124. Further details of PCB 124 and other components which may be housed in hollow interior 122 are provided below.

First end 104 of optoelectronic module 100 is configured to interface with one or more fiber optic cables (not shown), which may be releasably connected to first end 104. In one form where a fiber optic cable is releasably connected to optoelectronic module 100, optoelectronic module 100 may function as a stand-alone module. However, optoelectronic module 100 may be permanently attached to a fiber optic cable, and thus optoelectronic module 100 represents one end of an "active cable" which may include another optoelectronic module permanently attached to the other end of the fiber optic cable. In some embodiments, the fiber optic cable is a multichannel fiber-optic communication cable that includes two fibers, one of which is employed to transfer data signals in one direction, and the other of which is employed to transfer data signals in the opposite direction.

Optoelectronic module 100 may be designed to be plugged into a larger electronic system such as a PCB of a host device or the like. For example, optoelectronic module 100 may include a latching mechanism with a handle that may be operated to fasten or release optoelectronic module 100 with respect to other components In some configurations, the latching mechanism may include a slider operably connected to a cam and configured to cause the cam to rotate about an axis of rotation to displace an end of a latch to disengage the latch from a host receptacle. Once mounted to a host PCB, optoelectronic module 100 may be configured to communicate data between the host device and a network, for example. The subject matter disclosed herein is not limited to pluggable modules, and therefore forms in which optoelectronic module 100 does not include any type of latching mechanism are also possible.

Figure 4:
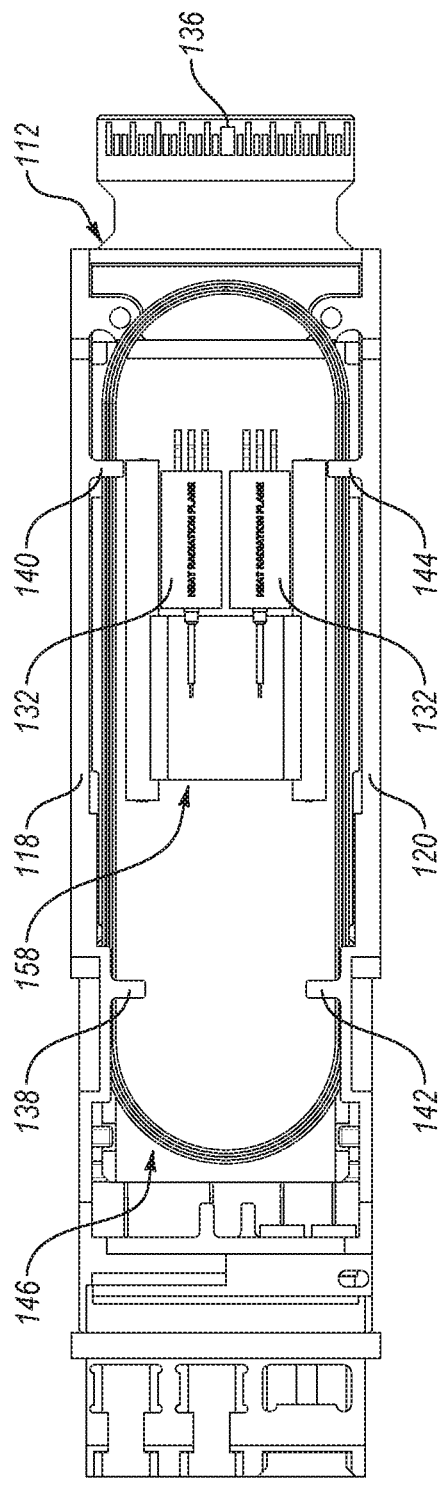
FIG. 4 is a plan view of a first side of the optoelectronic module of FIG. 1 with a portion of its housing removed.
Figure 5:
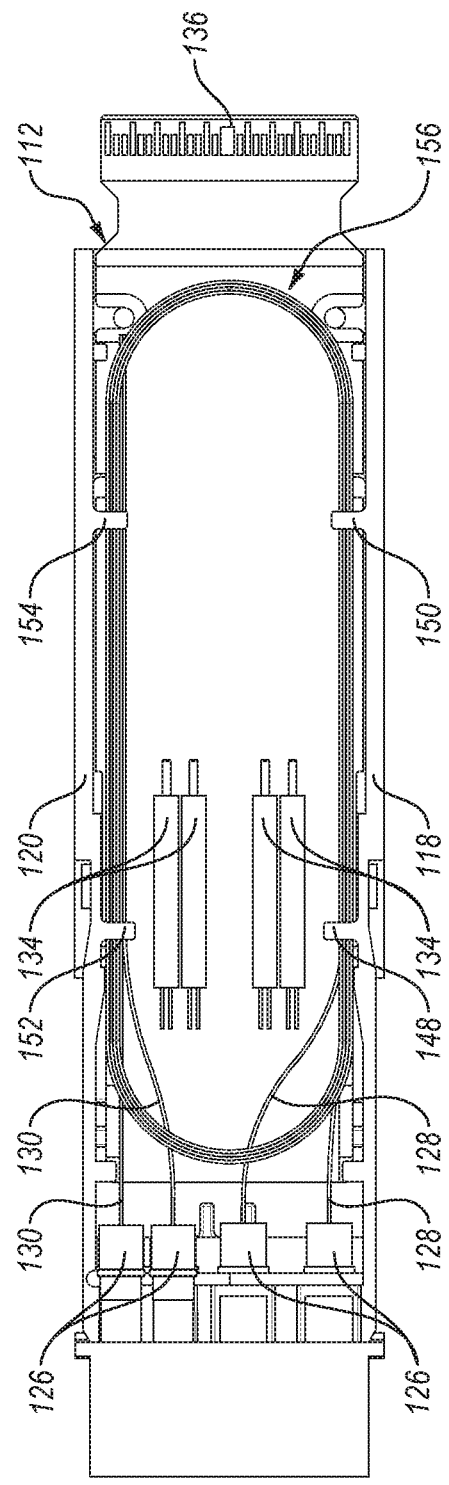
FIG. 5 is a plan view of an opposite, second side of the optoelectronic module of FIG. 1 with a portion of its housing removed.

With further reference to FIGS. 4 and 5 for example, PCB 124 may include transmit and receive amplifiers which may be combined or intertwined with one another, and are therefore not seen as separate components on PCB 124. Examples of other components which PCB 124 may include are a transmitter optical subassembly (TOSA) or a receiver optical subassembly (ROSA). A plurality of receptacles 126 may be optically coupled with various optical components via optical fibers 128 or 130. Alternative forms for optically coupling the optical components with receptacles 126 are contemplated. When present, a TOSA may include an array of transmitters and a ROSA may include an array of receivers. In addition to other components which may be present, optoelectronic module 100 includes pump lasers 132 and tap photodiodes 134 in the illustrated form. In the illustrated form, pump lasers 132 are positioned on a first side of PCB 124 while tap photodiodes 134 are positioned on a second, opposite side of PCB 124 along with a number of optical fibers forming fiber coil 156.

The various optical components of optoelectronic module 100 may be directly soldered to PCB, or they may be electrically coupled to PCB 124 with an electrical connector such as a flex circuit or other suitable electrical connector.

PCB 124 may include an edge connector 136 that is configured to be coupled with other components, such as a host device. As best seen in FIG. 1 for example, edge connector 136 is positioned between first cover 108 and second cover 110 of housing 102 to provide access to edge connector 136 by the host device. Similarly, it second end 106 of optoelectronic module 100 may be sized and shaped to interface with the host receptacle. In one form for example, optoelectronic module 100 may be positioned at least partially inside of the host receptacle and a latching mechanism, if present, may fasten or release optoelectronic module 100 with respect to the host receptacle.

Sidewall 118 of intermediate portion 112 of housing 102 includes a first pair of tabs 138, 140 extending into hollow interior 122. Similarly, sidewall 120 of intermediate portion 112 of housing 102 includes a first pair of tabs 142, 144 positioned on an opposite side of longitudinal axis L from tabs 138, 140 and extending into hollow interior 122. Tabs 138, 140 and 142, 144 cooperate to assist in positioning of the optical fibers of fiber coil 146 in hollow interior 122 relative to PCB 124 and other components of optoelectronic module 100. Sidewall 118 of intermediate portion 112 of housing 102 also includes a second pair of tabs 148, 150 extending into hollow interior 122 and positioned opposite of the first pair of tabs 138, 140. Similarly, sidewall 120 of intermediate portion 112 of housing 102 also includes a second pair of tabs 152, 154 positioned opposite of the first pair of tabs 140, 142 and on an opposite side of longitudinal axis L from tabs 148, 150. Tabs 152, 154 also extend into hollow interior 122, and in cooperation with tabs 148, 150, assist in positioning of the optical fibers of fiber coil 156 in hollow interior 122 relative to PCB 124 and other components of optoelectronic module 100.

Figure 6:
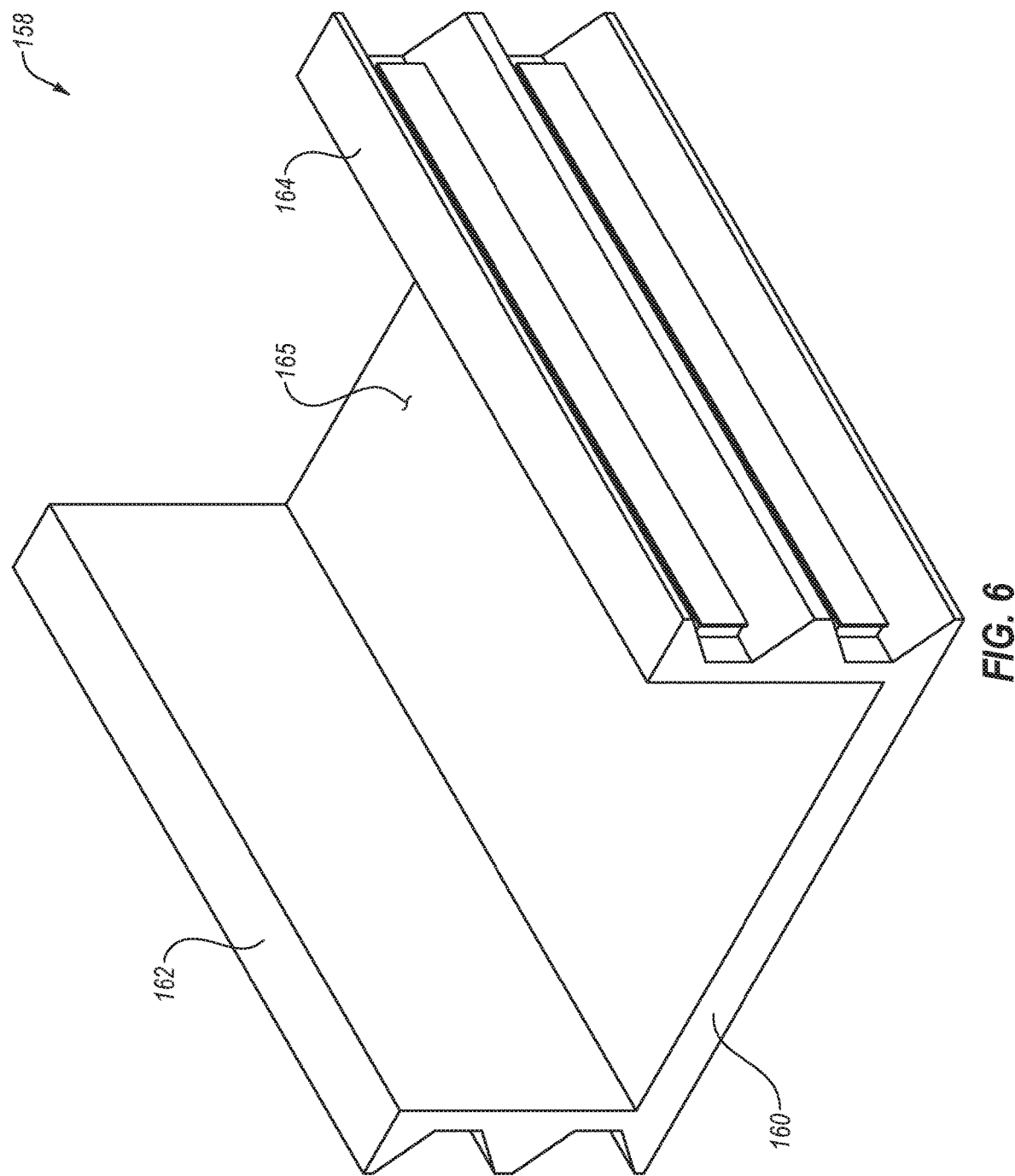
FIG. 6 is a perspective view of a positioning member of the optoelectronic module illustrated in FIG. 1.
Figure 7:
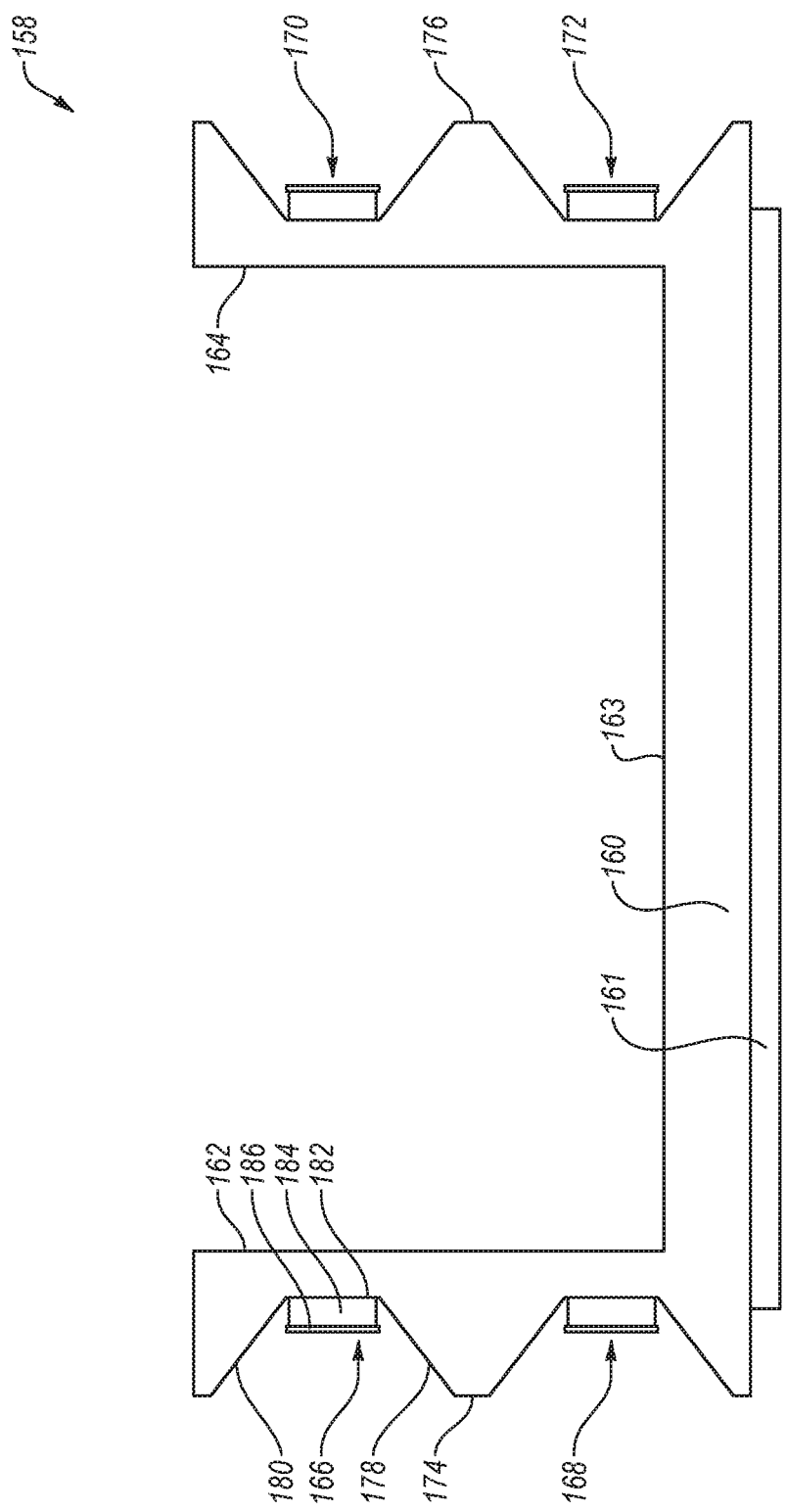
FIG. 7 is an end view of the positioning member illustrated in FIG. 6.

Optoelectronic module 100 further includes a positioning member 158 positioned on or coupled to PCB 124 on the same side of PCB 124 as, and adjacent to, pump lasers 132; however other variations in positioning are contemplated and possible. Generally speaking, positioning member 158 is structured to receive and secure positioning of a number of optical components that may be included in optoelectronic module 100. As best seen in connection with FIGS. 6 and 7 for example, positioning member 158 includes a base portion 160, a first vertical portion 162 extending from base portion 160, and a second vertical portion 164 extending from base portion 160. When positioning member 158 is positioned on PCB 124, first vertical portion 162 and second vertical portion 164 generally extend away from base portion 160 in a direction which is transverse to longitudinal axis L of optoelectronic module 100. A pressure sensitive adhesive 161 or other suitable adhesive may be positioned on a surface of base portion 160 and may be used to adhere or couple positioning member 158 to PCB 124. While not shown, pressure sensitive adhesive 161 may include a release liner which may be removed before positioning member 158 is positioned on PCB 124.

In the illustrated embodiment, first vertical portion 162 is laterally spaced from second vertical portion 164 such that positioning member 158 includes a surface 163 extending between vertical portions 162 and 164, and an open interior 165 in which one or more components of optoelectronic module 100 may be positioned. In other non-illustrated forms, the relative positioning of first vertical portion 162 and second vertical portion 164 may vary and, by way of example, in some forms positioning member 158 may include only one of first vertical portion 162 and second vertical portion 164. In these forms, the remaining vertical portion may retain the positioning of the illustrated form, although it is also possible that the vertical portion may also be positioned differently. For example, a single vertical portion could be positioned at or near the middle of base portion 160.

Positioning member 158 also includes receptacles 166, 168, 170 and 172, each of which is configured to receive and secure positioning of at least one optical component relative to positioning member 158 and PCB 124. In the illustrated form, first vertical portion 162 includes receptacles 166 and 168, and second vertical portion 164 includes receptacles 170 and 172. In this arrangement, receptacles 166 and 168 define a first vertical array of receptacles, and receptacles 170 and 172 define a second vertical array of receptacles. Moreover, when positioning member 158 is coupled to PCB 124, optical components positioned in receptacles 166 and 170 are positioned above and spaced apart from PCB 124, and receptacles 168 and 172 are positioned between receptacles 166 and 170 and PCB 124. In this arrangement, optical components positioned in receptacles 166 and 170 are positioned closer to first cover 108 such that heat generated from these components may rise toward, and be absorbed by, first cover 108 rather than other components in housing 102. As indicated above, first cover 108 includes features structured to facilitate transfer of heat from electronic module 100 to the ambient atmosphere surrounding optoelectronic module 100 during its use.

Receptacles 166 and 168 are generally separated by a ridge 174, and receptacles 170 and 172 are generally separated by a ridge 176. One or both of vertical portions 162 and 164 could include a different number of receptacles relative to what is shown in the illustrated form. For example, one or both of vertical portions 162 and 164 could include fewer receptacles than what is shown in the illustrated form, or one or both of vertical portions 162 and 164 could include more receptacles than what is shown in the illustrated form.

Receptacles 166 and 168 generally open in a direction facing away from second vertical portion 164, and receptacles 170 and 172 generally open in a direction facing away from first vertical portion 162. In this arrangement, optical components may be positioned in receptacles 168 and 170, and receptacles 172 and 174, from opposite sides of positioning member 158. However, other variations are contemplated. For example, forms are possible where one or both of vertical portions 162 and 164 includes one or more receptacles (in addition to or in lieu of receptacles 166, 168, 170, and 172) positioned opposite of the illustrated receptacles 166, 168, 170, and 172 and opening toward a respective one of first vertical portion 162 or second vertical portion 164. In these forms, one or more optical components may be partially positioned in open interior 165 and received in a corresponding receptacle on first vertical portion 162 or second vertical portion 164.

Receptacle 166 includes a first surface 178 which generally extends transversely to first vertical portion 162, and a second surface 180 which generally extends transversely to first surface 178 and first vertical portion 162. Similarly, first surface 178 and second surface 180 extend in a non-parallel fashion relative to one another. Receptacle 166 also includes a third surface 182 which extends between and connects first surface 178 and second surface 180. Third surface 182 also generally extends in-line with first vertical portion 162 and transversely to first surface 178 and second surface 180. A pressure sensitive adhesive 184 or other suitable adhesive may be positioned on third surface 182 and includes a liner 186 which may be removed before an optical component is positioned in receptacle 166 so that the optical component may be properly adhered by pressure sensitive adhesive 184 and retained in receptacle 166. In addition to or in lieu of third surface 184, one or both of first surface 178 and second surface 180 may include a pressure sensitive adhesive or other suitable adhesive. Each of receptacles 168, 170 and 172 in the illustrated form includes the same features which have been identified and described in connection with receptacle 166. These features have not been expressly identified in the accompanying figures to preserve clarity. In other non-illustrated forms, the features of receptacles 166, 168, 170 and 172 may vary relative to one another.

With reference to FIGS. 3 and 4 for example, positioning member 158 receives and secures positioning of optical components 188, 190, 192 and 194 relative to PCB 124 and other components of optoelectronic module 100. More specifically, optical component 188 is positioned in receptacle 166, optical component 190 is positioned in receptacle 168, optical component 192 is positioned in receptacle 170, and optical component 194 is positioned in receptacle 172. Optical components 188, 190, 192 and 194 generally extend parallel to longitudinal axis L, although different variations are possible depending on the exact positioning of positioning member 158 relative to PCB 124. In the illustrated arrangement, optical component 188 is vertically positioned over optical component 190, and optical component 192 is vertically positioned over optical component 194. Given the presence of positioning member 158, the optical components may be positioned in the illustrated arrangement without the use of any adhesive or similar materials between the individual optical components themselves or between these components and PCB 124, although such use is not precluded. For example, optical component 188 may be vertically positioned over optical component 190 without the presence of any adhesive or similar material between these components or between optical component 190 and PCB 124, and optical component 192 is vertically positioned over optical component 194 without the presence of any adhesive or similar material between these components or between optical component 194 and PCB 124.

Amongst other things, the vertical arrangement of optical components 188 and 190 relative to one another provides a space between these components and sidewall 118 of intermediate portion 112 of housing 102, and this space also extends from PCB 124 to first cover 108. A similar space is provided between sidewall 120 of intermediate portion 112 of housing 102 and optical components 192 and 194 given the vertical arrangement of these components. As a result, the optical fibers of fiber coil 146 may be vertically positioned on top of one another from PCB 124 to the underside of tabs 138, 140 and tabs 148, 150 which allows the optical fibers to be routed in an arrangement that is more conducive to the natural properties of the optical fibers. For example, the illustrated arrangement provides a larger and more consistent bend radius of the optical fibers relative to forms where, for example, the optical fibers are more generally positioned laterally or side by side to one another between the optical components and sidewalls 118 and 120 and the space is not open from PCB 124 to first cover 108. The illustrated arrangement may also provide conditions which are more suitable for sequential splicing operations, and the vertical arrangement of optical components 188 and 190 and of optical components 192 and 194 provide a wall-like structure which restrains lateral movement of the optical fibers within housing 102.

While not intending to be limited to any particular form, positioning member 158 may be formed through the extrusion of a plastic/polymeric material or a metallic material. Depending on its intended use, positioning member 158 may exhibit electrically or thermally insulative properties, electrically or thermally conductive properties, or have discrete portions each exhibiting electrically or thermally insulative properties or electrically or thermally conductive properties. By way of example, when electrically or thermally insulative properties are desired, positioning member 158 may be formed of a plastic/polymeric material, and when electrically or thermally conductive properties are desired, positioning member 158 may be formed of a metallic material. Depending on the use of positioning member 158, pressure sensitive adhesive 161 may be thermally or electrically conductive, or it may be thermally or electrically insulative. Similarly, pressure sensitive adhesive 184 in each of receptacles 166, 168, 170 and 172 may be thermally or electrically conductive, or it may be thermally or electrically insulative. Also, forms in which properties of pressure sensitive adhesive 184 vary between different ones of receptacles 166, 168, 170 and 172 are also possible. For example, pressure sensitive adhesive 184 in receptacle 166 could be thermally conductive while pressure sensitive adhesive 184 in remaining receptacles 168, 170 and 172 is thermally insulative.

As indicated above, use of positioning member 158 in optoelectronic module 100 may assist in regulating the temperature of optoelectronic module 100 because, for example, optical components positioned in receptacles 166 and 170 are positioned closer to first cover 108 such that heat generated from these components may rise toward, and be absorbed by, first cover 108 rather than other components in housing 102. Heat absorbed by first cover 108 may then be transferred to the ambient atmosphere surrounding optoelectronic module 100 during its use. Moreover, while not being limited to such a configuration, as described above the illustrated configuration of first cover 108 is intended to increase heat transfer to the ambient atmosphere due to its increased surface area provided by the presence of elongate fins 114.

The use of positioning member 158 with certain thermally conductive or insulative properties may also assist with controlling temperature of optoelectronic module 100 (including of components positioned therein), directing heat for efficient transfer from optoelectronic module 100, or both. In one form for example, use of a positioning member 158 formed from a thermally insulative material may be desired when one or more of the optical components positioned by positioning member 158 generates heat and positioning member 158 is positioned over or near one or more components of PCB 124 which are sensitive to increased temperatures. In this form, the insulative properties of positioning member 158 prevent or impede the transfer of heat through positioning member 158 and, in turn, limit the absorption of heat by PCB 124 or components included thereon. In this form, pressure sensitive material 161 may exhibit thermally insulative properties. In another form for example, when positioning member 158 is positioned over or near one or more components of PCB 124 which generate heat, such as a semiconductor package, then positioning member 158 may be formed of a thermally conductive material so that it can absorb heat from PCB 124 or relevant component(s) thereof and function as a heatsink, radiator or thermal conduit for PCB 124 or relevant component(s) thereof. In this form, pressure sensitive material 161 may exhibit thermally conductive properties.

In another form, positioning member 158 may be formed of a thermally conductive material when it is used with one or more optical components that generate heat such that positioning member 158 may serve as a heatsink or provide a thermal transfer function for these components. In this form, pressure sensitive material 184 in receptacles 166, 168, 170 and 172 in which the heat generating components are positioned may exhibit thermally conductive properties, while pressure sensitive adhesive 161 may exhibit thermally insulative properties, although other variations are contemplated and possible.

Figure 8:
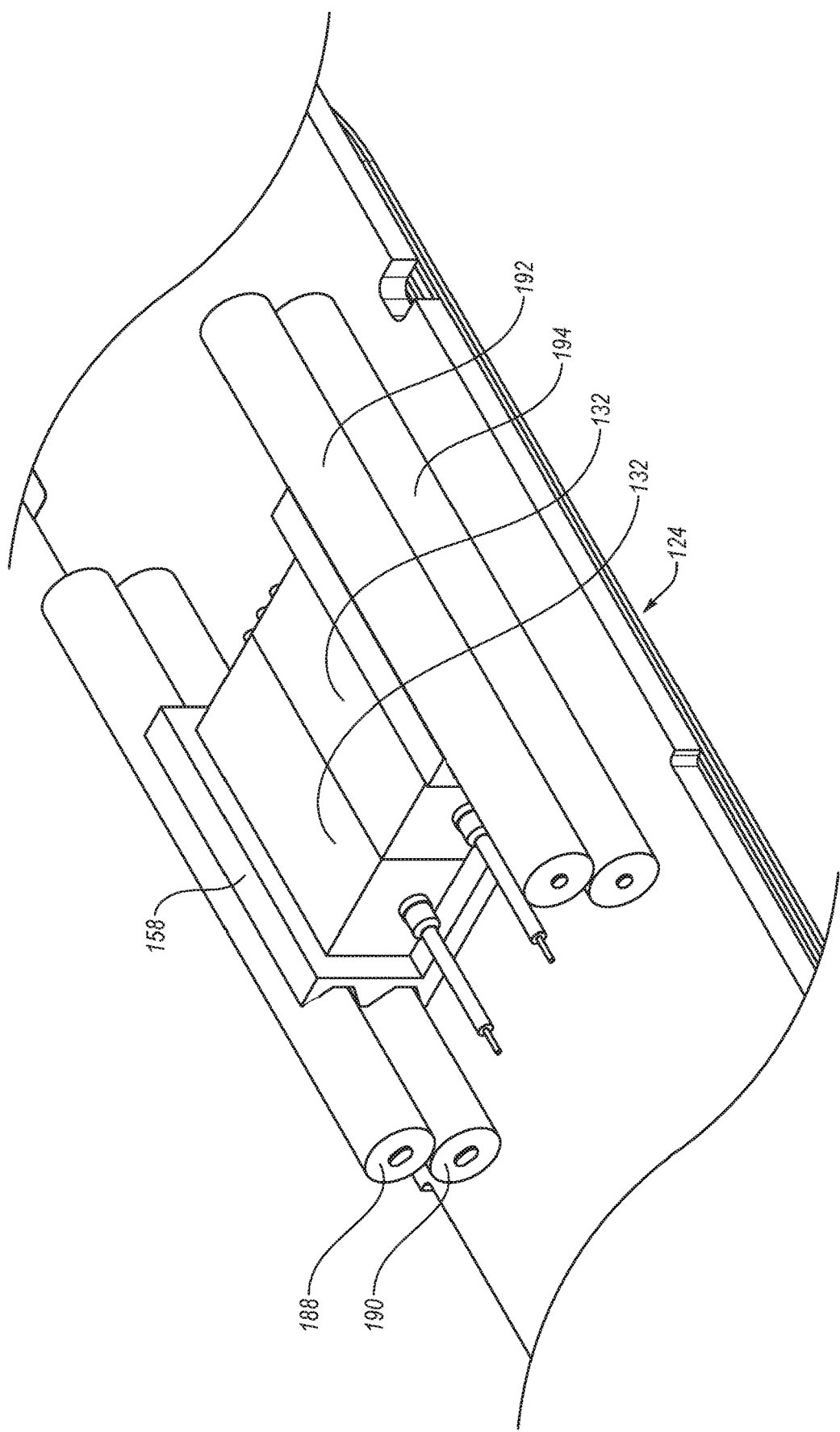
FIG. 8 is an enlarged, perspective view of an alternative arrangement of components in the optoelectronic module illustrated in FIG. 1.

In the form illustrated in FIGS. 3 and 4 for example, pump lasers 132 are positioned on PCB 124 at a location adjacent to positioning member 158. However, alternative variations for the positioning of pump lasers 132 relative to positioning member 158 are possible. For example, as illustrated in FIG. 8, pump lasers 132 are positioned on positioning member 158 (e.g., within open interior 165) which may be formed of a thermally conductive material such that it serves as a heatsink or provides a thermal transfer function for heat generated by pump lasers 132. In this form, pump lasers 132 may be coupled to positioning member 158 with a pressure sensitive adhesive which exhibits thermally conductive properties, and positioning member 158 may be coupled to PCB 124 with pressure sensitive adhesive 161 which exhibits thermally insulative properties, although other variations are contemplated and possible.

Figure 9:
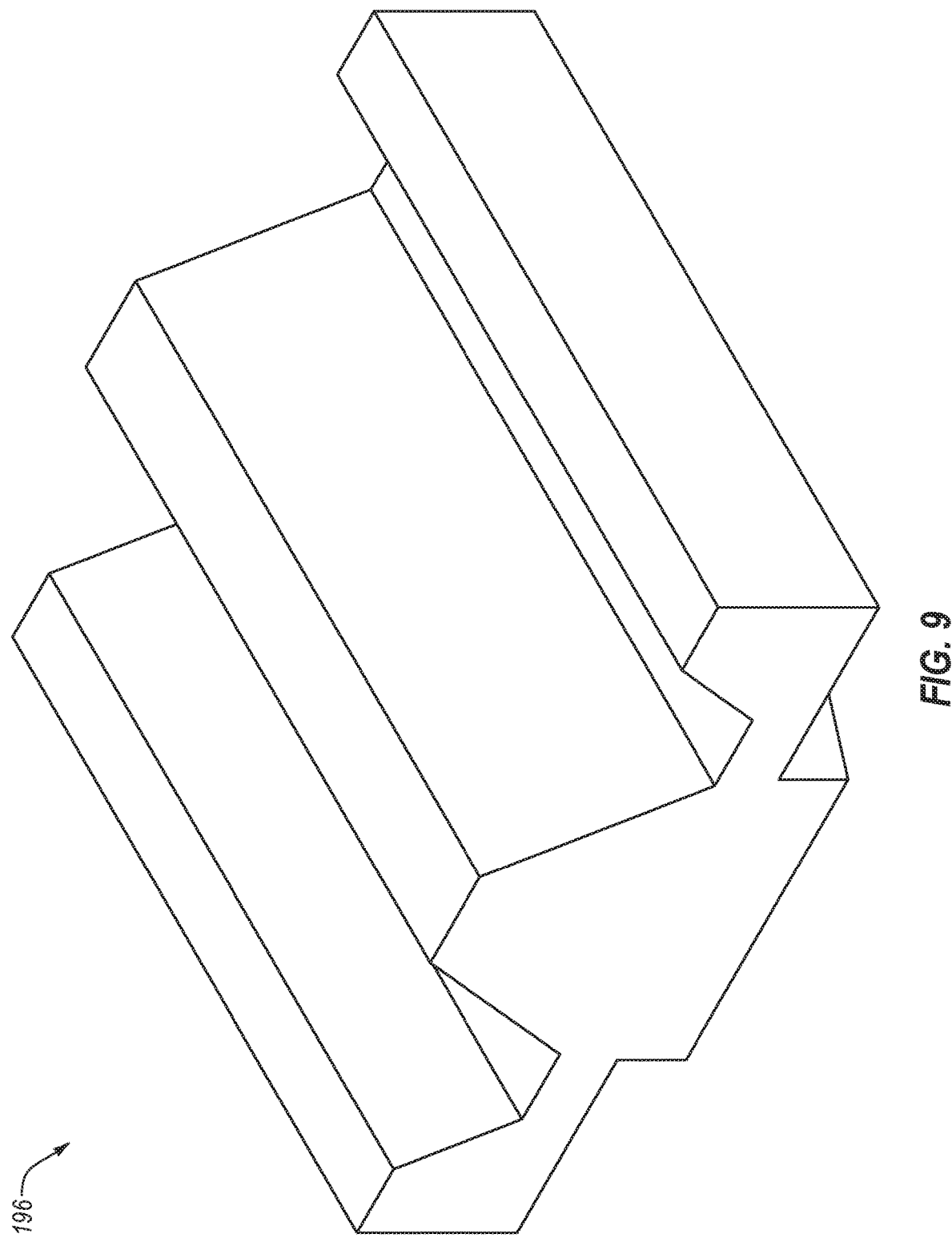
FIG. 9 is a perspective view of an alternative embodiment positioning member which may be used in the optoelectronic module illustrated in FIG. 1.
Figure 10:
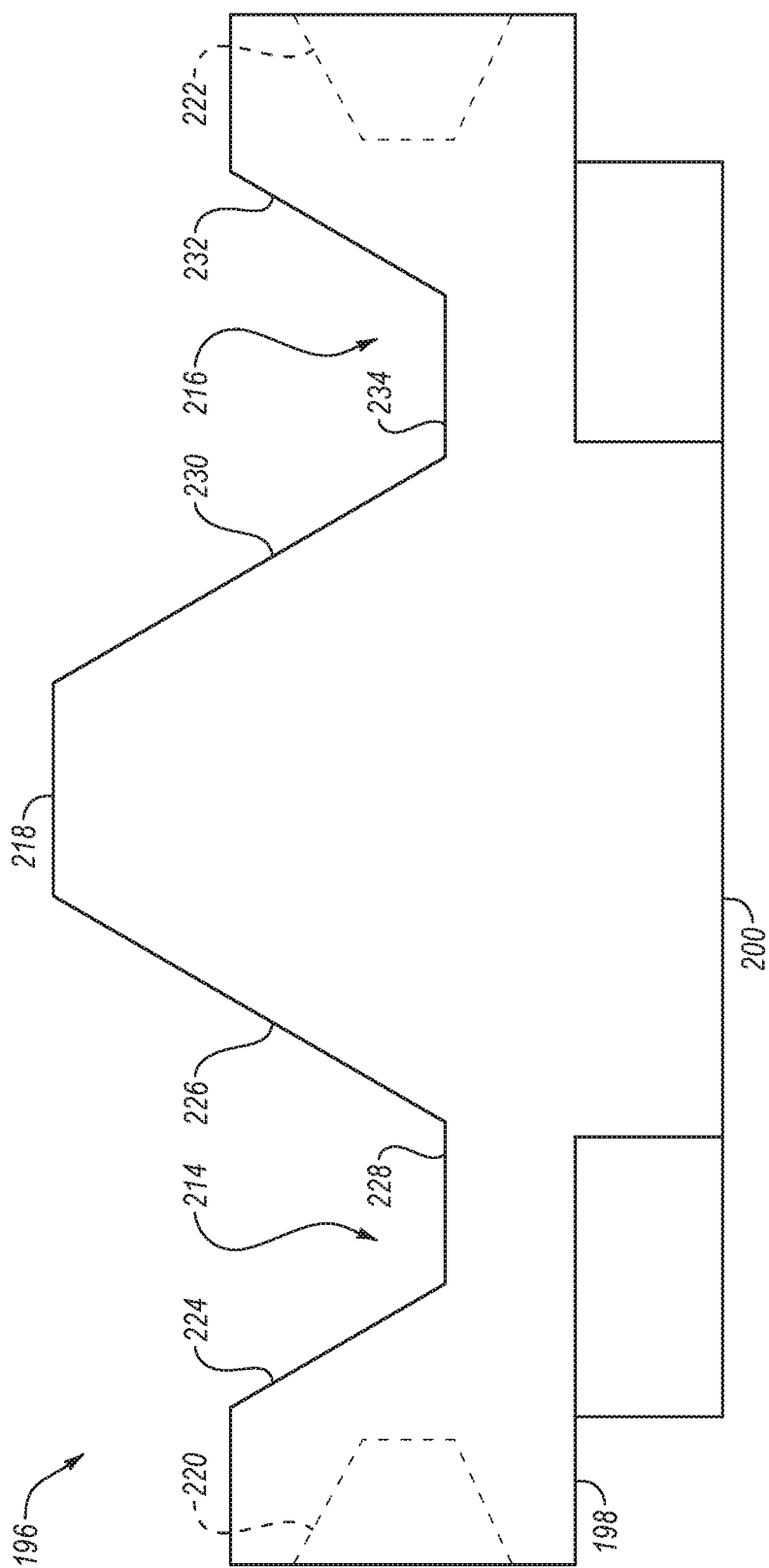
FIG. 10 is an end view of the positioning member illustrated in FIG. 9.
Figure 11:
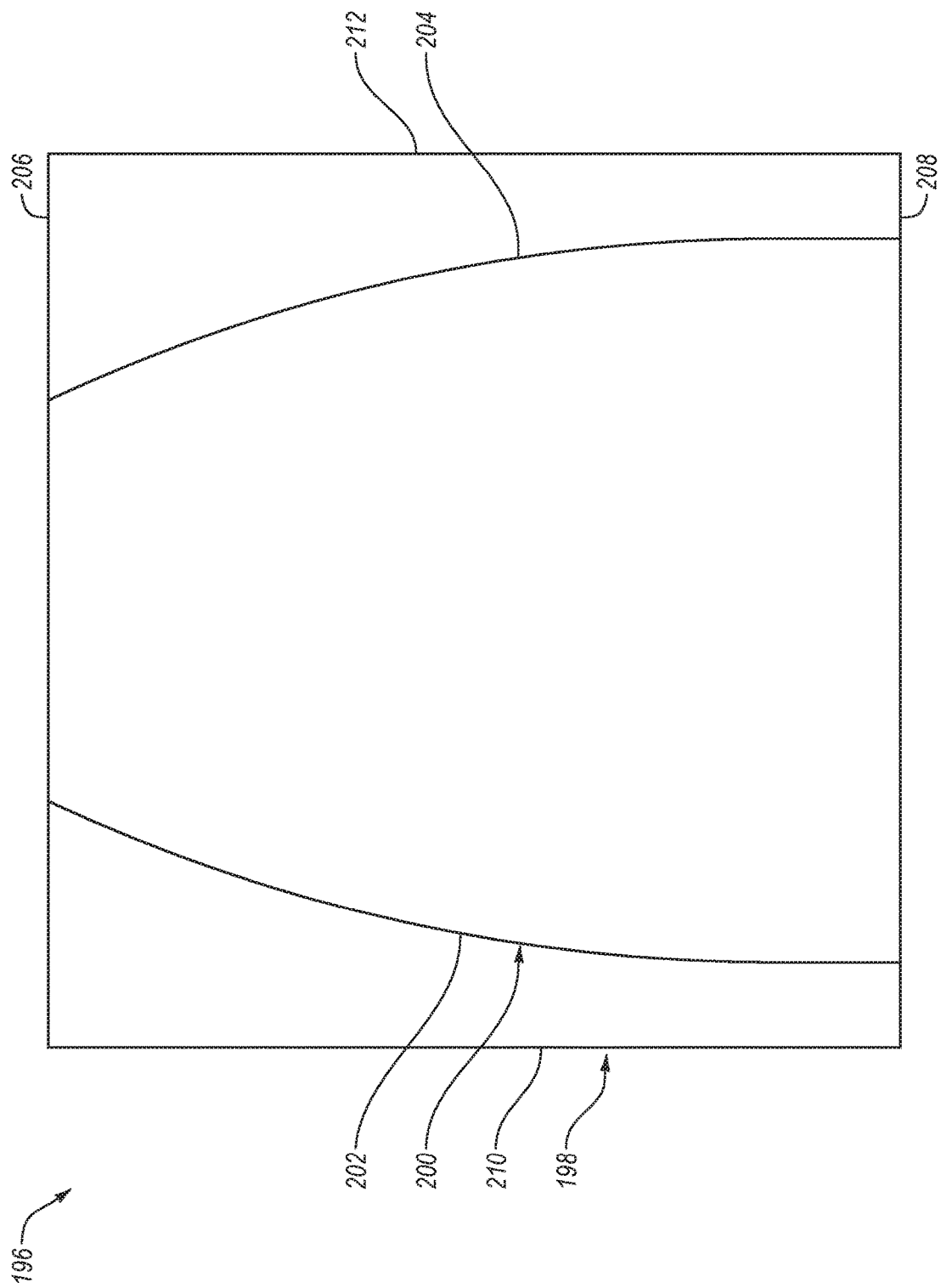
FIG. 11 is a plan view of a portion of the positioning member illustrated in FIG. 9 configured to engage with a printed circuit board.

An alternative embodiment positioning member 196 which may be included in optoelectronic module 100 in addition to or in lieu of positioning member 158 is illustrated in FIGS. 9-11. Generally speaking, positioning member 196 is structured to receive and secure positioning of a number of optical components that may be included in optoelectronic module 100. As best seen in connection with FIG. 10 for example, positioning member 196 includes a base portion 198 from which a mounting portion 200 extends. With reference to FIG. 11, mounting portion 200 includes a pair of oppositely positioned sidewalls 202 and 204 which extend between first end 206 and second end 208 of base portion 198. In the illustrated form, sidewalls 202 and 204 have a generally linear configuration adjacent second end 208 that transitions to a generally arcuate configuration approaching first end 206. In addition, sidewall 202 is inwardly spaced from first side 210 of base portion 198 while sidewall 204 is inwardly spaced from second side 212 of base portion 198. While a specific configuration of mounting portion 200 has been described, other variations in the size and shape of mounting portion 200 relative to base portion 198 are contemplated and possible. A pressure sensitive adhesive may be positioned on a surface of mounting portion 200 and may be used to adhere or couple positioning member 196 to PCB 124. The pressure sensitive adhesive may include a release liner which may be removed before positioning member 196 is positioned on PCB 124.

Positioning member 196 includes receptacles 214 and 216, each of which is configured to receive and secure positioning of at least one optical component relative to positioning member 196 and PCB 124. In the illustrated form, receptacles 214 and 216 are formed in base portion 198 and are laterally spaced from one another by a ridge 218. In this arrangement, receptacles 214 and 216 define a lateral array of receptacles. Positioning member 196 may include a number of receptacles in addition to receptacles 214 and 216. When positioning member 196 is coupled to PCB 124, optical components positioned in receptacles 214 and 216 are positioned above and spaced apart from PCB 124. For example, the presence of mounting portion 200 in combination with base portion 198 spaces receptacles 214 and 216 above PCB 124. In this arrangement, optical components positioned in receptacles 214 and 216 are positioned closer to first cover 108 such that heat generated from these components may rise toward, and be absorbed by, first cover 108 rather than other components in housing 102. As indicated above, first cover 108 includes features structured to facilitate transfer of heat from electronic module 100 to the ambient atmosphere surrounding optoelectronic module 100 during its use.

Receptacles 214 and 216 generally open in a direction facing away from mounting portion 200, and from PCB 124 when positioning member 196 is positioned on PCB 124. In this arrangement, optical components may be positioned in receptacles 214 and 216 from a side thereof opposite of PCB 124. However, other variations are contemplated. For example, positioning member 196 may also optionally include one or both, or more, of laterally opening receptacles 220 and 222 (shown in phantom in FIG. 10). When a plurality of receptacles 220, 222, or both are present, then positioning member 196 may provide a corresponding number of vertical arrays of receptacles formed by the respective number of receptacles 220 or 222 present. When laterally opening receptacles such as receptacles 220 and 222 are present, optical components may also be positioned in receptacles 220 and 222 from opposite sides of positioning member 196.

Receptacle 214 includes a first surface 224 which generally extends transversely to a second surface 226. Receptacle 214 also includes a third surface 228 which extends between and connects first surface 224 and second surface 226. Third surface 228 generally extends transversely to first surface 224 and second surface 226. Receptacle 216 includes a first surface 230 which generally extends transversely to a second surface 232. Receptacle 216 also includes a third surface 234 which extends between and connects first surface 230 and second surface 232. Third surface 234 generally extends transversely to first surface 230 and second surface 232. While not shown, a pressure sensitive adhesive or other suitable adhesive may be positioned on any one or more of surfaces 224, 226, 228, 230, 232, and 234. The pressure sensitive adhesive may include a liner which may be removed before an optical component is positioned in receptacle 214 or 216 so that the optical component may be properly adhered by the pressure sensitive adhesive and retained in receptacle 214 or 216. While not specifically discussed herein, the features of receptacles 214 and 216 may vary relative to one another.

Positioning member 196 may receive and secure positioning of one or more optical components relative to PCB 124 and other components of optoelectronics module 100. When present in receptacles 214 and 216, the optical components are laterally positioned relative to one another and may, for example, generally extend parallel to longitudinal axis L, although different variations are possible depending on the exact positioning of positioning member 196 relative to PCB 124. Given the presence of positioning member 196, the optical components may be positioned without the use of any adhesive or similar materials between the individual optical components themselves or between these components and PCB 124, although such use is not precluded.

In one form, positioning member 196 may be positioned in and used in combination with positioning member 158. However, positioning member 196 position may be used in combination with but spaced from positioning member 158, or positioning member 196 may be used without positioning member 158. When used alone and positioning member 196 is positioned near the center of PCB 124, a space may be provided between positioning member 196 and sidewall 118 of intermediate portion 112 of housing 102, and this space also extends from PCB 124 to first cover 108. A similar space may be provided between sidewall 120 of intermediate portion 112 of housing 102 and positioning member 196. As a result, the optical fibers of fiber coil 146 may be vertically positioned on top of one another from PCB 124 to the underside of tabs 138, 140 and tabs 148, 150 which allows the optical fibers to be routed in an arrangement that is more conducive to the natural properties of the optical fibers. An arrangement of this nature may provide a larger and more consistent bend radius of the optical fibers relative to forms where, for example, the optical fibers are more generally positioned laterally or side by side to one another between optical components and sidewalls 118 and 120. The illustrated arrangement may also provide conditions which are more suitable for sequential splicing operations, and the positioning of positioning member 196 may provide a wall-like structure which restrains lateral movement of the optical fibers within housing 102.

While not intending to be limited to any particular form, positioning member 196 may be formed through the extrusion of a plastic/polymeric material or a metallic material. Depending on its intended use, positioning member 196 may exhibit electrically or thermally insulative properties, electrically or thermally conductive properties, or have discrete portions each exhibiting electrically or thermally insulative properties or electrically or thermally conductive properties. By way of example, when electrically or thermally insulative properties are desired, positioning member 196 may be formed of a plastic/polymeric material, and when electrically or thermally conductive properties are desired, positioning member 196 may be formed of a metallic material. Depending on the use of positioning member 196, the pressure sensitive adhesive used to couple positioning member 196 to PCB 124 may be thermally or electrically conductive, or it may be thermally or electrically insulative. Similarly, the pressure sensitive adhesive used in receptacles 214 and 216 may be thermally or electrically conductive, or it may be thermally or electrically insulative. Also, forms in which properties of the pressure sensitive adhesive vary between receptacles 214 and 216 are also possible. For example, the pressure sensitive adhesive in receptacle 214 could be thermally conductive while the pressure sensitive adhesive in receptacle 216 is thermally insulative.

As indicated above, use of positioning member 196 in optoelectronic module 100 may assist in regulating the temperature of optoelectronic module 100 because, for example, optical components positioned in receptacles 214 and 216 are positioned closer to first cover 108 such that heat generated from these components may rise toward, and be absorbed by, first cover 108 rather than other components in housing 102. Heat absorbed by first cover 108 may then be transferred to the ambient atmosphere surrounding optoelectronic module 100 during its use. Moreover, while not being limited to such a configuration, as described above the illustrated configuration of first cover 108 is intended to increase heat transfer to the ambient atmosphere due to its increased surface area provided by the presence of elongate fins 114.

The use of positioning member 196 with certain thermally conductive or insulative properties may also assist with controlling temperature of optoelectronic module 100 (including of components positioned therein), directing heat for efficient transfer from optoelectronic module 100, or both. In one form for example, use of a positioning member 196 formed from a thermally insulative material may be desired when one or more of the optical components positioned by positioning member 196 generates heat and positioning member 196 is positioned over or near one or more components of PCB 124 which are sensitive to increased temperatures. In this form, the insulative properties of positioning member 196 prevent or impede the transfer of heat through positioning member 196 and, in turn, limit the absorption of heat by PCB 124 or components included thereon. In this form, the pressure sensitive material used to couple positioning member 196 to PCB 124 may exhibit thermally insulative properties. In another form for example, when positioning member 196 is positioned over or near one or more components of PCB 124 which generate heat, such as a semiconductor package, then positioning member 196 may be formed of a thermally conductive material so that it can absorb heat from PCB 124 or relevant component(s) thereof and function as a heatsink, radiator or thermal conduit for PCB 124 or relevant component(s) thereof. In this form, the pressure sensitive material used to couple positioning member 196 to PCB 124 may exhibit thermally conductive properties.

In another form, positioning member 196 may be formed of a thermally conductive material when it is used with one or more optical components that generate heat such that positioning member 196 may serve as a heatsink or provide a thermal transfer function for these components. In this form, the pressure sensitive material in receptacles 214 and 216 in which the heat generating components are positioned may exhibit thermally conductive properties, while the pressure sensitive material used to couple positioning member 196 to PCB 124 may exhibit thermally insulative properties, although other variations are possible.

The optical components described herein which may be received and positioned by positioning members 158 and 196 may be provided in a number of different forms and with a number of different functionalities. In some aspects, optical components may be present which perform a single function or multiple functions, or there may be single and multiple function optical components present. In one aspect, one or more of the optical components received and positioned by positioning members 158 and 196 may be fusion spliced fiber optical components. In some aspects, one or more of the optical components received and positioned by positioning members 158 and 196 generate heat during operation. Particular forms of the optical components which may be received and positioned by positioning members 158 and 196 include isolators, splitters, tap couplers, wavelength division multiplexers, gain flattening filters, combination isolators and wavelength division multiplexers, and combination isolators and gain flattening filters, just to provide a few examples.

In one aspect, the optical components which may be received and positioned by positioning members 158 and 196 may include fused-fiber devices housed in a cylindrical housing or packaging. In these components, bare fibers are epoxied into slotted glass rods which are further protected by a concentric layer of shrink tubing, and then covered by an outer concentric metal or glass tube to provide a reliable device that can withstand environmental conditions such as vibration and high humidity/high temperature exposure. The optical components which may be received and positioned by positioning members 158 and 196 may also include hybrid (i.e., multi-function) free-space components in which the optical signal from an incoming fiber is expanded with a collimating lens and then passed through two or more sections that produce desirable optical effects (such as isolation, beamsplitting or filtering) and then directed into an output fiber using a similar collimating lens. Hybrid free-space components of this nature may also be housed in a cylindrical housing or packaging.

With reference to optical components 188, 190, 192 and 194 shown in FIGS. 3 and 4 for example, these components may be provided with a configuration having a cylindrical housing or packaging, and the receptacles of positioning members 158 and 196 are configured for receiving optical components having this configuration. However, the shape or configuration of the receptacles of positioning members 158 and 196 may vary as the shape or configuration of the housing of the optical components intended to be received therein changes. For example, in the event the housing of the optical component includes a square or rectangular configuration, then one or more of the receptacles could be provided with a corresponding size and shape suited for receiving these optical components.

In one aspect, an optoelectronic module is provided with one or more components configured for managing heat created by one or more components contained therein to reduce the operating temperature of various components of the module and thereby potentially avoid undesired temperature driven performance issues of various components. In this or another aspect, an optoelectronic module includes a PCB having larger and heat-dissipating devices, such as laser pumps, positioned on its first side, and smaller optical components, such as taps, photodiodes and variable optical attenuators, positioned on its opposite, second side.

In one aspect, a method of assembling an optoelectronic module includes coupling a positioning having a number of receptacles for receiving and securing positioning of a number of optical components to a PCB. The method also includes positioning an optical component in at least one predetermined location defined by the location of the receptacle in which the optical component is being positioned. In an alternative form, a number of optical components may be arranged relative to one another and a positioning member as disclosed herein, and the positioning member may thereafter be coupled to a PCB.

Unless specific arrangements described herein are mutually exclusive with one another, the various implementations described herein can be combined to enhance system functionality or to produce complementary functions. Likewise, aspects of the implementations may be implemented in standalone arrangements. Thus, the above description has been given by way of example only and modification in detail may be made within the scope of the present invention.

With respect to the use of substantially any plural or singular terms herein, those having skill in the art can translate from the plural to the singular or from the singular to the plural as is appropriate to the context or application. The various singular/plural permutations may be expressly set forth herein for sake of clarity. A reference to an element in the singular is not intended to mean "one and only one" unless specifically stated, but rather "one or more." Moreover, nothing disclosed herein is intended to be dedicated to the public regardless of whether such disclosure is explicitly recited in the above description.

In general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). Furthermore, in those instances where a convention analogous to "at least one of A, B, and C, etc." is used, in general, such a construction is intended in the sense one having skill in the art would understand the convention (e.g., "a system having at least one of A, B, and C" would include but not be limited to systems that include A alone, B alone, C alone, A and B together, A and C together, B and C together, or A, B, and C together, etc.). Also, a phrase presenting two or more alternative terms, whether in the description, claims, or drawings, should be understood to include one of the terms, either of the terms, or both terms. For example, the phrase "A or B" will be understood to include the possibilities of "A" or "B" or "A and B."

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An optoelectronic module, comprising:
   a housing;
   a printed circuit board ("PCB") positioned within the housing; and
   a positioning member coupled to the PCB and including a number of receptacles each configured to receive and secure positioning of an optical component relative to the PCB,
   wherein a first of the optical component is spaced from the PCB when positioned in a first of the receptacles of the positioning member;
   wherein a second receptacle of the number of receptacles is positioned between the PCB and the first receptacle of the number of receptacles in an arrangement defining a vertical array of the first and second receptacles; and
   wherein each of the first and second receptacles includes a first surface, a second surface extending transversely to the first surface, and a third surface extending between and connecting the first and second surfaces.

2. The optoelectronic module of claim 1, wherein the positioning member includes a base portion and a first vertical portion extending from the base portion, and the first receptacle and the second receptacle are positioned in the vertical array on the first vertical portion.

3. The optoelectronic module of claim 1, wherein a ridge extends between and separates the first receptacle and the second receptacle.

4. The optoelectronic module of claim 1, wherein the third surface includes a pressure sensitive adhesive.

5. The optoelectronic module of claim 1, further comprising a second positioning member positioned in the housing, wherein the second positioning member includes a pair of laterally adjacent receptacles each configured to receive and secure positioning of at least one optical component relative to the PCB in an arrangement where the at least one optical component is spaced from the PCB.

6. The optoelectronic module of claim 5, wherein each of the pair of laterally adjacent receptacles includes a first surface, a second surface extending transversely to the first surface, and a third surface extending between and connecting the first and second surfaces.

7. The optoelectronic module of claim 1, wherein the positioning member includes a pair of laterally adjacent receptacles each configured to receive and secure positioning of at least one optical component relative to the PCB in an arrangement where the at least one optical component is spaced from the PCB.

8. The optoelectronic module of claim 7, wherein each of the pair of laterally adjacent receptacles includes a first surface, a second surface extending transversely to the first surface, and a third surface extending between and connecting the first and second surfaces.

9. The optoelectronic module of claim 1, wherein a pressure sensitive adhesive material is positioned between the PCB and the positioning member.

10. The optoelectronic module of claim 1, wherein the positioning member is at least partially formed of a thermally conductive material.

11. An optoelectronic module, comprising:
a housing;
a printed circuit board ("PCB") positioned within the housing; and
a positioning member coupled to the PCB and including a base portion, a vertical portion extending from the base portion, and a first receptacle and a second receptacle positioned on the vertical portion,
wherein the first receptacle and the second receptacle are configured to receive and secure positioning of an optical component relative to the PCB, and the first receptacle is positioned between the second receptacle and the PCB; and
wherein each of the first and second receptacles includes a first surface, a second surface extending in a non-parallel fashion relative to the first surface, and a third surface extending between and connecting the first and second surfaces.

12. The optoelectronic module of claim 11, wherein the vertical portion extends transversely to a longitudinal axis and the first surface and the second surface extend transversely to the vertical portion.

13. The optoelectronic module of claim 11, further comprising a first optical component positioned in the first receptacle and an optical fiber positioned between the positioning member and the housing.

14. An optoelectronic module, comprising:
a housing having a heat-dissipating exterior portion;
a printed circuit board ("PCB") positioned within the housing; and
a positioning member coupled to the PCB and including a number of receptacles each configured to receive and secure positioning of an optical component relative to the PCB,
wherein a first receptacle of the number of receptacles is spaced from the PCB toward the heat-dissipating exterior portion of the housing;
wherein a second receptacle of the number of receptacles is positioned laterally of the first receptacle; and
wherein at least one side of the positioning member includes a third receptacle of the number of receptacles configured to receive and secure positioning of a third optical component relative to the PCB, the third optical component spaced from the PCB when positioned in the third receptacle.

15. The optoelectronic module of claim 14, wherein the positioning member is formed of a thermally insulative material.

16. The optoelectronic module of claim 14, wherein the positioning member further includes a ridge extending between and separating the first and second receptacles, and each of the first and second receptacles includes a first surface, a second surface extending transversely to the first surface, and a third surface extending between and connecting the first and second surfaces.

17. The optoelectronic module of claim 14, wherein the positioning member comprises a mounting portion on a bottom thereof configured to mount to the PCB, the mounting portion having a pair of oppositely positioned sidewalls that curve from a first separation from one another at one end of the mounting portion to a second separation, smaller than the first separation, at another end of the mounting portion.

18. The optoelectronic module of claim 14, wherein the housing comprises an intermediate portion having sidewalls in which the PCB is positioned; and wherein the heat-dissipating exterior portion comprises a cover of the housing attached to the sidewalls.

19. The optoelectronic module of claim 2, wherein the positioning member comprises a second vertical portion extending from the base portion, the second vertical portion includes a pair of the receptacles arranged in a vertical array.

20. The optoelectronic module of claim 19, wherein the second vertical portion is spaced from the first vertical portion; and wherein the base portion between the first and second vertical portions supports one or more additional optical components at a distance from the PCB.

* * * * *